INVENTORS
Pieter J.W.Jochems.
Hendrikus G.Kock.
BY Reinier de Werdt.
Frank R. Jifani
AGENT June 6, 1967 P. J. W. JOCHEMS ETAL 3,324,360

HIGH FREQUENCY TRANSISTOR STRUCTURES EXHIBITING
LOW COLLECTOR CAPACITY AND LOW BASE RESISTANCE

Filed Feb. 20, 1964 2 Sheets-Sheet 2

INVENTORS
Pieter J.W. Jochems.
Hendrikus G. Kock.
Reinier de Werdt.

BY [signature]

AGENT 3,324,360

HIGH FREQUENCY TRANSISTOR STRUCTURES EXHIBITING LOW COLLECTOR CAPACITY AND LOW BASE RESISTANCE

Pieter Johannes Wilhelmus Jochems, Hendrikus Gerardus Kock, and Reinier de Werdt, all of Emmasingel, Eindhoven, Netherlands, assignors to North American Philips Company, Inc., New York, N.Y., a corporation of Delaware Filed Feb. 20, 1964, Ser. No. 346,167
Claims priority, application Netherlands, Mar. 29, 1963, 290,931
4 Claims. (Cl. 317—235)

This invention relates to transistors, especially suitable for high frequencies, comprising in a semi-conductor body in succession a collector zone, a base zone and an emitter zone of alternately opposite conductivity type, the junction between the collector zone and the base zone occupying a limited portion of the cross-section of the body, and an emitter zone being locally provided in the said base zone, while a substantially metallically conductive base contact layer, through which a supply conductor is locally provided on the base zone, occupies a considerable portion of the surface of the base zone and the said contact layer substantially encloses the emitter zone which is present in a recess of the contact layer and provided with a supply conductor.

In known transistors of this kind, which may be of the so-called mesa type or planar type, the base zone is usually provided as a surface layer by diffusion of an impurity of a given type into a body of opposite type. The emitter zone is then provided in a surface portion of the base zone by simultaneous or subsequent diffusion or alloying. It has also previously been suggested to manufacture the base zone and/or the emitter zone by epitaxial growth from the vapour phase, combined with a diffusion treatment, if desired.

The surface of the p-n-junction between the base zone and the collector zone is limited to a portion of the original cross-section of the body in order to reduce the capacity of the collector and hence improve the behaviour at higher frequencies. For this purpose, in transistors of the so-called mesa type, after the emitter- and/or base contact layers are provided, the base zone is removed by etching, except the surface intended for the contact layers and the intermediate space and, if desired, a small clearance space around the contacts. In transistors of the so-called planar type, the collector junction is limited by diffusing the base zone right from the beginning only into the surface portion ultimately intended for the contact layers and, if desired, a small clearance space around them, or by growth from the vapour phase. For this purpose, the surface of the body is previously covered with a mask consisting, for example, of silicon oxide applied by evaporation, said mask leaving only the desired surface uncovered.

For the behaviour at high frequencies, not only a reduction of the collector capacity is required, but also, in order to obtain a low noise level, a low resistance of the base, the more so as in high-frequency transistors, the small thickness of the base zone, for example less than 2 microns, involves an increase of the base resistance. With a large number of known transistors which have not to meet particularly high requirements with respect to their frequency range, it is considered sufficient to arrange the base contact and the emitter contact side by side in the form of pellets or elongated strips, an emitter contact being arranged, if desired, between two base contacts. For a still higher frequency range, however, the requirement of a low resistance of the base becomes even more important and the aim is to cover the surface of the base zone with a substantially metallically conductive layer which surrounds the emitter zone preferably entirely, but at least substantially. In known embodiments of such a high-frequency transistor in which the base contact layer surrounds the emitter zone entirely, the emitter zone has a circular cross-section and the base contact layer is provided around the emitter zone in the form of a ring substantially concentric therewith and of substantially contact thickness. For planar transistors it has also previously been suggested to widen the said ring at the area where the supply conductor is secured.

According to the invention it is possible to obtain a considerable further improvement in the properties of a high-frequency transistor of the kind described in the preamble in which the base contact layer surrounds, at least substantially, the emitter zone, if the recess in the base contact layer has an elongated shape and an elongated emitter zone is provided in the said recess substantially coaxially, while the base contact layer which surrounds the recess at least substantially, preferably entirely, locally has along the circumference of the recess, a widened border or marginal area to which the supply conductor is secured. For example, the recess and the emitter zone may advantageously have approximately the shape of elongated rectangles which may be rounded at their corners, or of hemi-circles or, according to another preferred embodiment, approximately of ellipses. The term "elongated" is to be understood herein to mean that the dimensions of the emitter zone and the recess in the longitudinal direction are at least 1.2 times their width dimensions in the transverse direction. Preferably, the longitudinal dimension is from approximately 1.3 to 2 times the transverse dimension. If the longitudinal transverse dimension locally varies as is the case, for example, with an elliptic shape, the length and width are meant to indicate the maximum length and the maximum width. The emitter zone also has an elongated shape and is situated substantially coaxially in the recess, which means that the longitudinal axes and the transverse axes of the recess and the emitter zone are substantially coincident and the emitter zone and the recess are of substantially identical shape, which makes it also possible that an emitter zone of elongated and substantially rectangular shape lies in a substantially elliptic recess.

Since in a transistor according to the invention, instead of the known circular shape, a recess and an emitter zone of elongated shape are employed, the advantage is obtained inter alia that a lower resistance of the base occurs with otherwise the same surface of the emitter zone and the same distance from the base contact layer since especially the distance between the central portion of the emitter zone and the surrounding base contact layer is reduced. Moreover, in comparison with a circular shape, the elongated shape provides a considerably greater circumference of the emitter zone with otherwise the same surface of the emitter zone and since the injection takes place especially from the marginal portions at high frequencies and/or higher injection currents, a larger portion of the surface of the emitter zone can effectively participate in the injection, this larger portion moreover being located at a short distance from the base contact layer, which thus also results in a decrease of the base resistance.

The base contact layer has a widened portion only at the area where the supply conductor is secured, and may be considerably narrower along the remaining part of its circumference. In comparison with the known transistor of the mesa type having a concentric ring of uniform thickness as a base contact this means a reduction of the surface of the base contact and since by subsequent etching or by previous local diffusion, the circumference of the junction between the base zone and the collector zone can be limited so that it substantially follows the circumference of the base contact layer with, if desired, a small clearance space around it, this means at the same time a reduction of the collector capacity. The reduction of the base resistance and the higher injection owing to the use of a recess and an emitter zone of elongated shape may also be utilized completely or in part to reduce the surface of the emitter zone, due to which the surrounding base contact layer may also become smaller resulting in a further reduction of the collector capacity. The width of the base contact layer can be and, according to the invention, is preferably smaller than ⅔ of the width (in case of varying width, the maximum width is meant) of the emitter zone, except at the area of the widened portion. On the other hand, this width must not be too small, in order to prevent undue increase in the resistance of the layer. The width of the border is advantageously approximately half the width of the emitter zone.

The elongated shape of the recess and the emitter zone has the additional advantage that the fastening of a supply conductor is simplified since on an elongated emitter zone, a greater amount of clearance is possible at least in one direction and also supply conductors having an elongated shape of the near point of connection on the emitter zone fit more readily into the recess. In this connection, the elongated shape of the recess and the emitter zone may also advantageously be utilized when on the elongated emitter zone and preferably also on the widened portion of the base contact layer, a supply conductor is secured by means of a thermo-compression bond which may generally have an elongated surface connected with the emitter zone and/or adjoining it near the point of connection. In fact, if in such thermo-compression bonding, as is preferably the case, use is made of a pressure chisel having an elongated press surface in order to obtain a greater amount of clearance in directing and adjusting the chisel in a direction at right angles to the supply conductor, the supply conductor is widened at right angles to its longitudinal direction at the area of compression bonding, resulting in an elongated shape of the impression and the area of attachment transverse to the supply conductor. If in practice only the shape of this area of attachment need be taken into account, the supply conductor will thus preferably be provided, at least near the area of attachment, so that its longitudinal direction is substantially at right angles to the longitudinal direction of the elongated emitter zone. In other cases, however, especially if only a small amount of clearance exists in the emitter zone, and the junction between the emitter zone and the base zone lies free at the surface and directly adjoins, for example, the metallic base contact layer, the supply conductor may advantageously be provided, at least near the area of attachment with its longitudinal direction substantially in the longitudinal direction of the recess. This latter embodiment is connected with the fact found by surprise that during the establishment of a thermo-compression bond, the material of the supply conductor on either side of the widened and flattened area of attachment is pushed away over the surface of the substrate also in the longitudinal direction of the supply conductor practically without giving rise to attachment, it is true, but still so that the supply conductor engages the substrate over a considerable distance in the longitudinal direction, which may be considerably larger than the maximum dimension at the widened area of attachment of the supply conductor may approach the substrate so closely that short-circuit may result. Therefore, if no special steps are taken to avoid this effect, it is the elongated shape of the supply conductor in the longitudinal direction that must be taken into account. On the other hand, if this disadvantageous effect can be avoided, for example, by preventing short-circuit in the longitudinal direction of the supply conductor due to the presence of an insulating oxide film at the junction between the emitter zone and the base zone, the elongated shape of the area of attachment at right angles to the supply conductor is to be taken into account.

The sizes of the recess and the emitter zone are preferably matched to the elongated shape and the size either of the supply conductor in the longitudinal direction or of the compression bond transverse thereto, so that the supply conductor fits into the recess with a small amount of clearance. For a given structure of the semi-conductor body, this means a substantially optimum compromise between the solution of fastening difficulties, on the one hand, and the obtainments of a low resistance of the base and a low capacity of the collector, on the other hand.

Many further variations in the shape of the base contact layer and in the position of the recess therein are possible within the scope of the invention. Suitable embodiments according to the invention are, for example, those in which the circumference of the base contact layer is substantially circular, elliptical or rectangular, and the widened portion consists in that the center of the recess, which has, for example, approximately the shape of a hemicircle, an ellipse, or a rectangle, has a shifted position with respect to the center of the base contact layer. In this case, corresponding shapes of the base contact layer and the recess are preferably combined, so that, for example, both are elliptical.

Especially when the frequency range has to satisfy particularly high requirements, a further decrease of the collector capacity can be obtained if, according to the invention, the base contact layer has, at the area of the widened portion, approximately the same elongated shape and preferably substantially the same size as the emitter zone in the recess while the remaining portion of the recess is surrounded, at least substantially, by a thinner border. The widened portion then offers the same possibilities of fastening a connecting wire and, consequently, a supply conductor is secured thereto by thermo-compression bonding preferably in the same manner as this is done on the emitter zone. In an embodiment which has proved to be particularly suitable, the base contact layer has, at the area of the widened portion, an elongated portion the long side of which adjoins the long side of the elongated recess. In another suitable embodiment, the longitudinal dimension of the elongated portion of the base contact layer is in line with the longitudinal axis of the elongated recess. In the first-mentioned embodiment, the supply conductors can advantageously be arranged in the longitudinal direction of the elongated recess and the elongated portion of the base contact layer, and in case of fastening by means of thermo-compression bonding, this embodiment is preferably used when the elongated shape of the thermo-compression bond in the longitudinal direction has to be taken into account. In the last-mentioned embodiment, the supply conductors are advantageously arranged in parallel and at right angles to the elongated recess and the elongated portion of the base contact layer, and in case of fastening by thermo-compression bonding, this embodiment can especially be used when substantially only the elongated shape of the area of attachment need be taken into account. Since the supply conductors are parallel to each other, both embodiments have the advantage that the pressure chisel can establish both thermo-compression bonds in only one direction of movement and that contact between the ends of the supply conductors is not likely to occur, since the conductors are located in parallel planes with a certain spacing between them. Consequently, owing to the specific arrangement of the supply conductors, both embodiments are particularly favourable to provide both the emitter zone and the widened portion of the base contact layer with a double supply conductor which comprises the combined portions of one supply conductor projecting on either side of the area of attachment. As a result of the double supply, the high-frequency properties are improved further since the supply resistance is then reduced by 50% for the same diameter of the supply conductor. The embodiment mentioned above, in which the elongated zone and an elongated portion of the base contact layer are in line with each other, is also particularly favourable to secure a supply conductor to both the base zone and the base contact layer, these conductors being substantially co-planar with their secured ends facing each other. The fastening of the supply conductors is thus simplified, since one supply conductor can first be directed over the emitter zone and the elongated portion of the base contact layer and be secured to the emitter zone and the elongated portion, where after said supply conductor is cut between the recess and the elongated portion, the portions remote from each other being used as separate supply conductors.

In order to obtain a low resistance of the base and make an efficacious use of the whole circumference of the emitter zone, the base contact layer preferably surrounds the emitter zone entirely although, in certain cases, a small interruption may be permitted, that is to say that the interruption as measured along the circumference of the recess, should be smaller than the maximum width of the recess, so that the base contact layer still surrounds substantially the whole emitter zone.

The invention is advantageously applicable to transistors of the so-called planar type, in which event the surface of the base zone is located beneath a protective oxide film at the area of the junction between the collector zone and the emitter zone, so that the base contact layer cannot occupy the whole base surface. The invention is also advantageously applicable to transistors of the mesa type in which the base zone locally projects above the collector zone as a result of the etching treatment. In such mesa transistors, the surface of the base zone can be covered with a contact layer practically as far as very close to the collector junction and at some distance from the emitter zone, so that the invention provides a considerable improvement with respect to the circular emitter zone and the concentric base contact layer which are usually employed therein. However, the invention is particularly important and especially advantageous and simple to practise in those transistors in which the emitter zone consists of a diffusion layer which fills substantially the whole recess and is surrounded by the recrystallisation layer of the base contact layer which constitutes the ohmic connection with the base layer. For in the latter transistors, the surface required for the recess is minimum for a given surface of the emitter zone and the surface of the base zone can be coated substantially with the base contact layer, resulting in a minimum surface area of the collector junction. Moreover, the base contact layer can be provided around the emitter zone in a very simple manner in that either the base contact layer is alloyed in the desired form through a previously-diffused emitter zone, or the emitter zone is diffused into the recess of a previously-provided base contact layer of aluminum as described in the co-pending patent application Ser. No. 346,191, filed Feb. 20, 1964, so that only a suitable mask is required for the evaporation deposition of the base contact layer in the desired shape.

The invention is preferably applied to transistors in which the surface area of the junction between the base zone and the collector zone is smaller than $10{,}000\mu^2$ and the thickness of the base is less than 2 microns since the frequency range has to meet particularly severe requirements especially in such transistors.

The transistor structure according to the invention and a few particular embodiments thereof will now be described more fully, by way of example, with reference to the accompanying diagrammatic drawings, in which.

Figure 1:
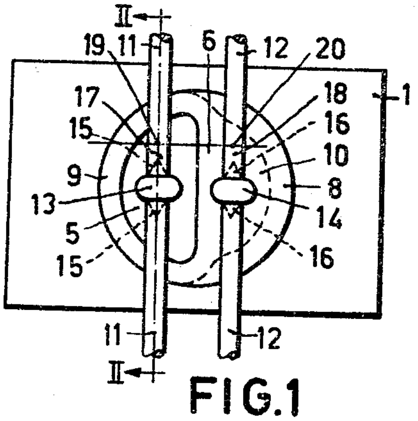
FIGURES 1, 3 to 8 and 11 are plan views of a few particular embodiments of a transistor according to the invention.
Figure 2:
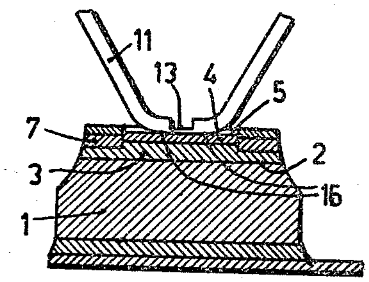
FIGURE 2 is a cross-sectional view of the transistor shown in FIGURE 1, taken along the broken line II—II.

FIGURES 1 and 2 relate to an n-p-n-type germanium transistor whose n-type conductive collector zone 1, which has a resistivity of approximately 0.5 ohm-cm., passes through a p-n-junction 2 into a p-type conductive base zone 3. In the manner usual for a mesa transistor, the junction 2 occupies a limited part of the original cross-section of the body, which latter is apparent from FIGURE 2 at the collector zone and is, for example, approximately 5 mm.$^2$. An n-type conductive emitter zone 4, which is provided by diffusion of, for example, arensic into part of the p-type conductive base layer 3 and which has a thickness of approximately $0.6\mu$, is located in a recess 5 of a substantially metallic contact layer 6 which completely surrounds the recess 5 and the emitter zone 4. The metallic contact layer 6 consists, for example, of aluminum containing a few at. percent of indium which has alloyed with the germanium during the melting process, thus forming a p-type conductive recrystallisation layer 7.

As may clearly be seen from FIGURE 1, the recess 5 and hence coaxially therewith the emitter zone 4, which completely occupies the semi-conductor surface in the recess 5, have an elongated shape which is approximately identical with that of a hemicircle rounded at its corners, the circumference 8 of the base contact layer being substantially circular. Since the center of the recess 5 has a shifted position with respect to the center of the base contact layer 6, the base contact layer has a widened border 10 beside the recess 5, but a thinner border 9 along the remaining circumference of the recess. The circular circumference 8 of the base contact layer has an outer diameter of, for example, about 60 microns, while the position and the shape of the recess substantially correspond to a hemicircle drawn from the center of the circular circumference 8 with a radius of approximately 20 microns. The maximum dimension of the recess in the longitudinal direction (direction of the line II—II) is thus approximately 40 microns and in the transverse direction approximately 20 microns. Outside the widened portion the width of the border of the base contact layer 6 is approximately 10 microns, which is half the width of the recess.

As appears from FIGURE 2, the collector junction 2 is substantially limited to a surface area equal to the sum of the recess 5 and the base contact layer 6, that is to say that the collector zone has a surface area of approximately $3{,}000\mu^2$. If desired, the surface area of the collector junction may be limited still further by etching the junction 2 further away from beneath the base contact.

The emitter zone 4 and the wide border 10 of the base contact layer are provided with double supply conductors 11 and 12, respectively, consisting, for example, of gold wires of 7 microns thick which are locally attached to the relevant area by means of so-called thermo-compression bonding. The attachment by means of thermo-compression bonding is a securing method known per se in the semi-conductor technique, in which a supply conductor is secured to a substrate consisting, for example, of a semi-conductor of metal contact usually with simultaneously heating to a temperature below the eutectic temperature of the supply conductor and the material of the substrate, by pressing the connecting wire onto the substrate by means of a pressure chisel consisting, for example, of sapphire with a force such that the supply conductor and the substrate are joined together with simultaneous flattening and deformation of the supply conductor. In the present case, a pressure chisel having an elongated press surface (8 microns x 20 microns) was pressed on the gold wire at a temperature of approximately 340° C. and with a pressure at which the thickness of the gold wire was reduced approximately by 50% at the area of the impression.

In FIGURE 1, the reference numerals 13 and 14 denote the flattened parts formed under the pressure chisel which substantially correspond to the surface of attachment. The supply wires 11 and 12 are widened in the longitudinal direction to approximately 15 microns over a distance of approximately 8 microns. FIGURE 2 also shows in cross-section the flattened part 13 in the direction of length of supply conductor 11, taken on the line II—II of FIGURE 1.

However, it is further apparent from FIGURES 1 and 2 that outside the flattened parts 13 and 14 on either side of the thermo-compression bond, the supply conductor engages in its longitudinal direction over a certain distance, that is to say over the surface 15 with the surface of the emitter zone 4 or at least adjoins it so closely that short-circuit could occur with the base contact layer 6, if, for example, the clearance space in the longitudinal direction of the recess is not sufficient. For it has been found that in the longitudinal direction of the supply conductor 11, the distance over which the supply conductor is pressed, at least during its application, against the surface of the emitter zone 4 under slight pressure, but without being secured thereto, can be considerably larger than the maximum widening at the area of attachment 13. In the present case, this distance is approximately 24 microns. Unless special steps are taken, the supply conductor 11 will therefore preferably be provided, as was also the case in FIGURES 1 and 2, in the longitudinal direction of the recess 5 notwithstanding the widened portion at the area of attachment 13. In FIGURE 1, the end faces of the supply conductors 11 and 12 (in FIGURE 2, that of supply conductor 11 is designated 15) formed on either side of the area of attachment 13 and 14 are designated 15 and 16, respectively, said faces being omitted in the longitudinal direction of the supply conductors and approximately bounded by the broken lines 15 and 16. The contact surface can be interrupted again indeed by lifting the supply conductors after their attachment, but the material of the supply conductor has yet been pressed away over the substrate during the fastening process and short-circuit may have occurred already.

As is further apparent from FIGURE 1, at the area of the widened portion 10, the base contact layer 6 also has an elongated surface the long side of which adjoins the long side of the recess 5. Consequently, this embodiment has the advantage that the supply conductor 12 can also be arranged on the elongated widened portion 10 in an analogous manner with its length in the direction of length of the longest dimension of the widened portion 10, the two supply conductors 11 and 12 being located in substantially parallel planes with a certain spacing between them, so that short-circuit between the supply conductors 11 and 12 is not likely to occur. It is thus also rendered possible in a simple manner, as shown in FIGURES 1 and 2, to make the supply conductors of twin type by combining the ends projecting on each side. If this additional advantage is not desired, however, only one projecting wire portion is also sufficient as a supply conductor and the compression bond can be established at the end thereof so that the wire portions situated on one side of the compression bonds 13 and 14 and outside the line indicated by 19 and 20, respectively, are omitted.

An n-p-n-type transistor having the dimensions already specified hereinbefore, the base layer 3 of which was approximately 1$\mu$ thick beneath the emitter zone 4 and which compromised single supply conductors 11 and 12, was found to have exceptionally good high-frequency properties inter alia due to the present invention. Thus, the amplification factor may be from 13 to 16 db at 800 mc./s. It has been found that the cut-off frequency can be 2,000 mc./s. or even higher and moreover, the noise factor can be exceptionally low, i.e. from 5 to 6 db, which hints at a very low resistance of the base which is from 25 to 50 ohms with a given small thickness of 1$\mu$ for the base zone 3.

This transistor is preferably manufactured in the manner described in the co-pending patent application, Ser. No. 346,191, for example, by diffusing a p-type conductive layer 3 of approximately 1.6 microns thick into an n-type conductive germanium plate 1. For this purpose the plate containing a supply of In and Ge (approximately 60 at. percent of In) is heated at approximately 800° C. for approximately 2 hours. Subsequently, a metal layer consisting substantially of aluminum to which a small quantity of indium may be added and which has the shape and the recess shown in FIGURE 1 is applied by evaporation in a thickness of from 0.3 to 0.4$\mu$ to the said p-type conductive layer, which serves as the base zone, and alloyed with the p-type layer at, for example, 700° C. Next, an n-type conductive emitter zone of approximately 0.6$\mu$ thick is diffused into the recess of the base contact layer 6 by heating the assembly for approximately 9 minutes at approximately 650° C. in an arsenic vapour which is supplied from a quantity of arsenic heated to 440° C. During diffusion, the aluminum is in the molten state and inhibits the diffusion of arsenic at the area where it is applied thereby avoiding a short-circuit of the base contact to the emitter. Afterwards, the portions of the n-type layer located outside the base contact layer and the base zone are removed by etching in the usual manner. Although use is preferably made of this method, it is also possible for the n-type conductive emitter zone 4 to be diffused in part or, if desired, even completely into the p-type conductive layer prior to the application of the aluminum layer. If, however, according to a known method, the aluminum is applied only after the n-type conductive layer 4 has diffused completely, the junction between the emitter zone and the base zone must be improved afterwards by a careful etching treatment or otherwise, for example, by using a lower surface concentration of the arsenic during the diffusion process, in order to prevent short-circuit of the junction and obtain a suitable value for the breakdown voltage.

In FIGURE 1, the recess and the emitter zone are chosen of a size such that the elongated compression bond fits into the recess with a small amount of clearance. Preferably, the widened portion 10 of the base contact layer also has the same elongated shape and substantially the same size as the emitter zone, in order to obtain a lower capacity of the collector while maintaining the favourable resistance of the base. In this respect, it is also even more advantageous to follow, in the embodiment of FIGURE 1, the circumference of the broken line instead of following the circular circumference 8 in the widened portion 10.

Figure 3:
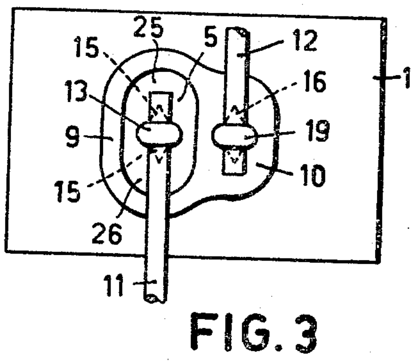

FIGURE 3 shows another suitable embodiment of a transistor according to the invention which differs from that of FIGURE 1 only in the following points: the recess 5 and hence the emitter zone 4 are substantially elliptical and consist, for example, of two hemicircles 25 and 26 of approximately 25 microns in diameter which are spaced apart approximately 10 microns and which are interconnected over this distance by straight lines. The widened portion 10 of the base contact layer, which is situated beside the elliptical recess 5, also has an elongated shape and occupies substantially the same surface area as the recess. The recess 5 is surrounded by a thinner border 9 of the base contact layer which is, for example, 12 to 15 microns thick and adjoins the widened portion 10. The supply wires 11 and 12 are situated with their direction of length in the longitudinal direction of the recess 5 and the widened portion 10 and is parallel with each other in order to provide the end faces 15 and 16 near the compression bond. Otherwise the remarks made with reference to FIGURE 2 also hold good for FIGURE 3.

Figure 4:
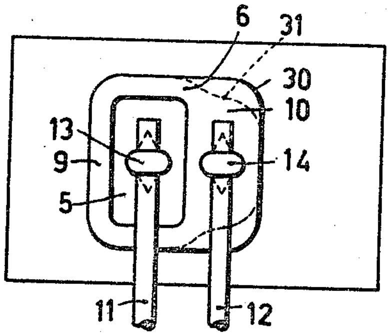

FIGURE 4 shows a base contact layer 6 having a substantially rectangular circumference and a substantially rectangular recess 5. Apart from the rounded portions at the corners, the dimensions of the recess are, for example, approximately 25 microns x 35 microns, the thickness of the border outside the widened portion being from 10 to 15 microns. It is even more advantageous also in this case, to make the surface area of the widened portion 10 substantially equal to that of the recess 5 and of the emitter zone located inside it, so that the circumference follows the broken line 31 in the widened portion 10.

Figure 5:
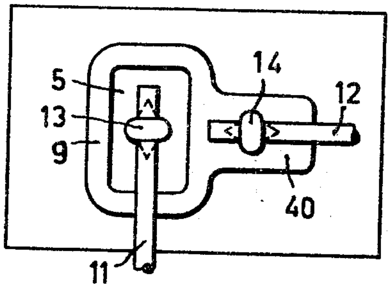

The embodiment shown in FIGURE 5 differs from the embodiment of FIGURE 4 indicated by the broken line 31 only in that the long side of the widened portion 10 is substantially at right angles to the longitudinal direction of the recess 5 and in that the connecting wire 12 is correspondingly turned so as to be substantially at right angles to the supply conductor 11.

Figure 6:
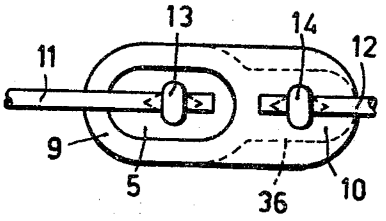
Figure 7:
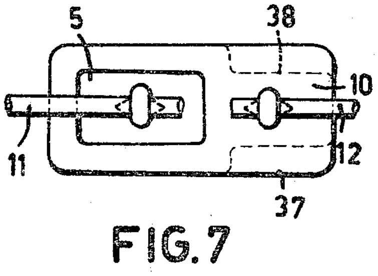

In FIGURE 6, the recess is approximately elliptical and has a size, for example, as was already shown in FIGURE 3. The circumference 35 of the base contact layer is also elliptical and the recess 5 has a shifted position therein so that a border 9 of the base contact layer results having a thickness of from 12 to 15 microns, whilst the widened portion 10, measured in the longitudinal direction of the recess, has approximately the same length as the recess 5. It is even more advantageous if the base contact layer in the widened portion 10 follows the circumference of the broken line 36, resulting in an embodiment in which the recess 5 and the elongated portion 10 of the widened portion are in line with each other in the longitudinal direction and have substantially the same size. This embodiment is particularly suitable to position the supply conductors 11 and 12, as is also shown in FIGURE 6, so as to be substantially co-planar with the areas of attachment 13 and 14 and with their ends facing each other, which can be effected in a simple manner by laying one wire in the longitudinal direction across the recess 5 and the widened portion 10 and after having secured it to the emitter zone in the recess 5 and the widened portion 10, cutting this wire between the recess 5 and the widened portion 10. FIGURE 7 shows an embodiment analogous to that of FIGURE 6 on the understanding that the recess 5 is substantially rectangular, which is also the case with the circumference 37 of the base contact layer which can follow still better the broken line 38 at the area of the widened portion 10.

Figure 8:
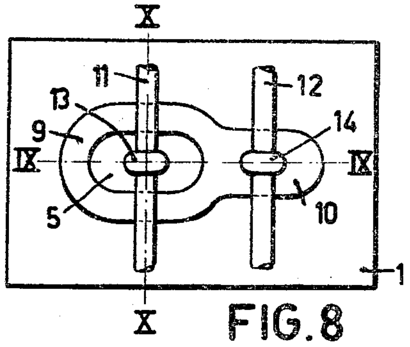
Figure 9:
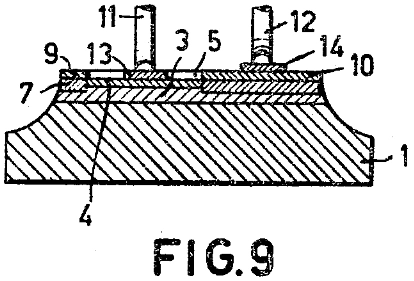
FIGURES 9 and 10 are two different cross-sections of the transistor shown in FIGURE 8, taken along the broken lines IX—IX and X—X, respectively.
Figure 10:
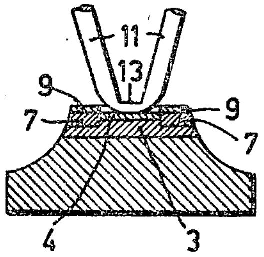

FIGURES 8 to 10 show another embodiment in which the supply wires 11 and 12 of the single or double type (as shown in the figure) are positioned parallel to each other and at right angles to the longitudinal direction of the recess 5 and the portion 10. The recess 5 and the widened portion are again of substantially the same size and are aligned in their longitudinal directions. The border outside the widened portion 10 is approximately 12 to 15 microns thick and adjoins the elliptical widened portion 10 which has the same size as the recess 5 the dimensions of which were already specified, by way of example, with reference to FIGURE 3. This shape of the recess and the base contact layer is especially advantageous to arrange the supply conductors 11 and 12 parallel to each other and each at right angles to the longitudinal direction of the recess 5 and the elongated portion 10 of the base contact layer, which will be the case if not the elongated shape of the compression bond resulting from the end faces 15 and 16 in FIGURE 1, but rather the elongated shape of the areas of attachment 13 and 14 themselves are to be taken into account since an oxide film present on the aluminum base-contact layer 6, consisting of the thin border 9 and the widened portion 10, prevents short-circuit during the fastening process, or since, as is apparent from FIGURE 10, the supply wires are pulled up during compression or afterwards in combination with a cleaning treatment so that the end faces 15 and 16 (see FIGURE 1) are prevented from being formed or at least from causing permanent short-circuit. It should be noted in this connection that the embodiments shown in FIGURES 1, 3, 4 and 8 have the further advantage that the compression bonds of the supply conductors 11 and 12 can be established in one direction of movement of the pressure chisel, since the elongated areas of attachment 13 and 14 are in line with each other. In FIGURES 9 and 10, further parts corresponding to FIGURES 1 and 2 are indicated by the same reference numerals.

Figure 11:
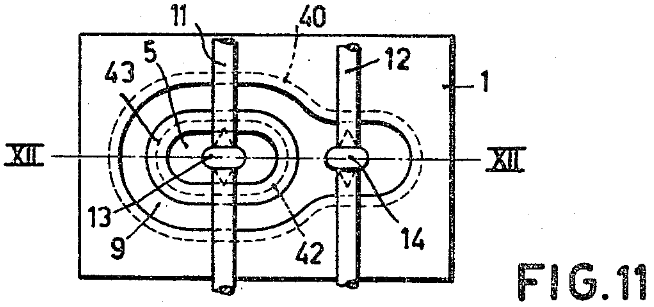
Figure 12:
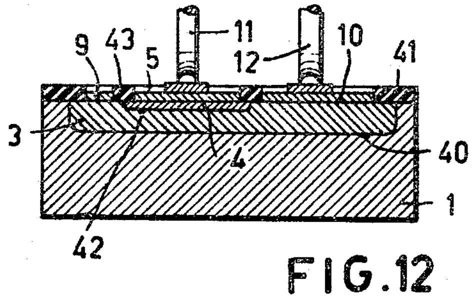
FIGURE 12 is a cross-sectional view of the transistor shown in FIGURE 11, taken along the broken line XII—XII.

FIGURES 11 and 12 relate to a planar silicon transistor according to the invention. The base contact layer consisting of the thin border 9 and the widened portion 10 has substantially the same shape as in the embodiment of FIGURE 8. A junction 40 between the base zone and the collector zone 1, however, is now beneath a silica film 41 which covers substantially entirely the upper side of the body outside the base contact layer (6, 9), as is usual for a planar transistor. The emitter zone 4 (see also FIGURE 12) has an elongated shape as has the recess 5, but a junction 42 between the base zone 3 and the emitter zone 4 is at the surface again beneath a silica film 43. The presence of the oxide films 41 and 43 may protect against a short circuit at the junctions, for example the junction 43, so that in a planar transistor, as also shown in the figure, it may be particularly useful to arrange the supply conductors parallel to each other and with their direction of length substantially at right angles to that of the recess 5 and the widened portion 10, in which event substantially only the elongated shape of the area of attachment 13 has to be taken into account.

Finally, it is to be noted that, within the scope of the invention, many variations are possible for a man skilled in the art. For example, the embodiments shown in FIGURES 1 to 7 may also advantageously be applied to planar transistors if the oxide film does not protect the material sufficiently from out flowing in the longitudinal direction of the supply conductors. The various shapes of the base contact layer and the recess may also advantageously be applied to known mesa transistors having an alloyed emitter zone in a diffused base zone. In the embodiments shown in the various figures, the supply conductor on the base contact layer may also be turned by 90°, if desired, since short-circuit effects are less likely to occur on the base contact layer. The supply conductors may also be secured to the relevant portions otherwise, for example by soldering. The transistors according to the invention may also advantageously be used in so-called integrated circuits in which they are built in a semi-conductor body together with other circuit elements. The collector junction may be limited to a surface area smaller than that of the base contact layer and the recess by partly etching it away from beneath the base contact layer.

What is claimed is:

1. A high-frequency transistor comprising a semiconductive body the major portion of which constitutes a collector zone of one type conductivity, a diffused base zone of the opposite type conductivity occupying only a small part of the body and having portions thereof available for contacting at one major surface of the body, a single emitter zone of said one type conductivity occupying only a part of the base zone and located wholly within and surrounded by the base zone except for a portion also available for contacting at the said one major surface, said base zone forming p–n junctions with the emitter and collector zones, said emitter zone in a plane substantially parallel to the said major surface being elongated such that its longitudinal dimension is at least 1.2 times its width dimension in the transverse direction, a conductive annular base contact member contacting a major fraction of the base zone surface portions and completely surrounding the emitter zone surface portion and comprising a conductive border portion defining an elongated opening having the shape of one of a single hemicircle, ellipse, and rectangle and which substantially matches and registers with the elongated form of the emitter zone, said border portion having a first part whose width dimension is substantially in the same direction as and substantially smaller than the width dimension of the emitter zone and a single elongated second part which is enlarged in the width direction to a width at least substantially equal to that of the emitter zone, said second part extending parallel to or in line with the elongated emitter zone, a first wire thermocompression bonded substantially at the center of the emitter zone surface portion to form an emitter lead, a second wire thermocompression bonded substantially at the center of the enlarged second part of the base contact border portion to form a base lead, said second wire extending parallel to or in line with the first wire, and a contact to the collector, whereby a transistor exhibiting low collector capacitance and low base resistance is obtained.

2. A high-frequency transistor as set forth in claim 1 wherein the said longitudinal dimension of the emitter zone is between 1.3 and 2 times its width dimension, the width dimension of the first part of the base contact border portion is smaller than ⅔ of the width of the emitter zone, and the width of the enlarged second part is approximately the same as that of the emitter zone.

3. A high-frequency transistor as set forth in claim 1 wherein the first wire thermocompression bonded to the emitter zone forms an elongated contact area in register with the elongated opening in the base contact.

4. A high-frequency transistor as set forth in claim 1 wherein the area of the junction between the base zone and the collector is less than 10,000 square microns, and the spacing between the last-named junction and the junction between the emitter and base zones is less than 2 microns.

References Cited

UNITED STATES PATENTS

| | | | |
|---|---|---|---|
| 2,999,195 | 9/1961 | Saby | 317—235 |
| 3,100,927 | 8/1963 | Stelmak | 29—25.3 |
| 3,204,321 | 9/1965 | Kile | 29—25.3 |

JOHN W. HUCKERT, *Primary Examiner.*

R. SANDLER, *Assistant Examiner.*